(12) United States Patent
Kiebler et al.

(10) Patent No.: US 9,857,404 B2
(45) Date of Patent: Jan. 2, 2018

(54) METHOD AND DEVICE FOR DETERMINING A RESISTANCE VALUE OF A PLURAL NUMBER OF ACTUATING DEVICES AND METHOD AND DEVICE FOR CONTROLLING A PLURAL NUMBER OF ACTUATING DEVICES IN A VEHICLE TRANSMISSION CONTROL UNIT

(71) Applicant: ZF Friedrichshafen AG, Friedrichshafen (DE)

(72) Inventors: Horst Kiebler, Eriskirch (DE); Ralf Brauchle, Bergatreute (DE); Kristian Mueller, Tettnang (DE); Peter Sigg, Immenstaad (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 406 days.

(21) Appl. No.: 14/490,013

(22) Filed: Sep. 18, 2014

(65) Prior Publication Data
US 2015/0077146 A1 Mar. 19, 2015

(30) Foreign Application Priority Data
Sep. 19, 2013 (DE) .................. 10 2013 218 762

(51) Int. Cl.
*G01R 27/02* (2006.01)
*G01R 27/14* (2006.01)

(52) U.S. Cl.
CPC .................................. *G01R 27/14* (2013.01)

(58) Field of Classification Search
CPC .................................................... G01R 27/14

USPC ........................................................ 324/713
See application file for complete search history.

(56) References Cited

U.S. PATENT DOCUMENTS

| 4,636,620 A | * | 1/1987 | Wright | F02D 41/20 |
| | | | | 123/478 |
| 5,442,515 A | * | 8/1995 | Wallaert | H03K 17/64 |
| | | | | 123/490 |
| 5,818,178 A | | 10/1998 | Marumoto et al. | |
| 6,111,514 A | * | 8/2000 | Cossins | B60T 8/885 |
| | | | | 340/654 |
| 6,943,540 B2 | | 9/2005 | Vincent et al. | |
| 8,649,152 B2 | | 2/2014 | Schoeneck et al. | |
| 2004/0012380 A1 | * | 1/2004 | Vincent | B60T 8/36 |
| | | | | 324/117 R |
| 2015/0204931 A1 | * | 7/2015 | Scholl | B60T 8/36 |
| | | | | 324/503 |

OTHER PUBLICATIONS

German Patent Office Search Report, dated Jul. 22, 2014.

* cited by examiner

*Primary Examiner* — Melissa Koval
*Assistant Examiner* — Courtney McDonnough
(74) *Attorney, Agent, or Firm* — Dority & Manning, P.A.

(57) ABSTRACT

A method for determining a resistance value of a plural number of actuating devices is provided. The method features a step of the application of a test current pulse at each of the plural number of actuating devices. Moreover, the method features the step of the evaluation of a total current of output currents of the plural number of actuating devices engaging on the test current pulses at a measuring resistor, in order to determine the resistance value of the plural number of actuating devices.

9 Claims, 4 Drawing Sheets

METHOD AND DEVICE FOR DETERMINING A RESISTANCE VALUE OF A PLURAL NUMBER OF ACTUATING DEVICES AND METHOD AND DEVICE FOR CONTROLLING A PLURAL NUMBER OF ACTUATING DEVICES IN A VEHICLE TRANSMISSION CONTROL UNIT

FIELD OF THE INVENTION

The present invention relates to a method for determining a resistance value of a plural number of actuating devices, a method for controlling a plural number of actuating devices, a device for determining a resistance value of a plural number of actuating devices, a device for controlling a plural number of actuating devices and a corresponding computer program product, in particular for use in conjunction with actuators of a transmission control unit of a vehicle or the like.

BACKGROUND

Actuators of transmissions are controlled, for example, by means of current controllers that issue an analog current. With an exemplary transmission control, PWM controllers (PWM, pulse width modulation) are used for this purpose; they realize a required current by means of a variable PWM. In order to know the current that is actually flowing, in particular, an actuator resistance is to be calculated.

DE 196 08 756 A1 discloses a valve control device for a motor vehicle, with which a main chopper transmission of the H-bridge type is operated by a PWM control signal of a microcomputer, in order to thereby drive an engine for controlling a throttle valve.

SUMMARY

Against this backdrop, the present invention provides an improved method for determining a resistance value of a plural number of actuating devices, an improved method for controlling a plural number of actuating devices, an improved device for determining a resistance value of a plural number of actuating devices, an improved device for controlling a plural number of actuating devices, and an improved computer program product in accordance with the main requirements. Additional objects and advantages of the invention will be set forth in part in the following description, or may be obvious from the description, or may be learned through practice of the invention.

In one embodiment, the present invention relates to a method for determining a resistance value of a plural number of actuating devices, whereas the method features the following steps:

Application of a test current pulse at each of the plural number of actuating devices; and Evaluation of a total current of output currents of the plural number of actuating devices engaging on the test current pulses at a measuring resistor, in order to determine the resistance value of the plural number of actuating devices.

The plural number of actuating devices may feature valves, in particular magnetic valves or the like. The method may also record or evaluate a resistance value of one of the plural number of actuating devices (in particular, for each one). The plural number of actuating devices may be part of a transmission control unit of a vehicle. The vehicle may comprise a motor vehicle, for example a road-bound motor vehicle such as a passenger car or a truck. A test current pulse may feature pre-determinable or definable properties. Thus, a test current pulse may feature a pre-determinable or definable current strength. In the step of application, a test current pulse with the same properties may be applied to each of the plural number of actuating devices. In the step of application, the test current pulses may be imprinted on input currents of the plural number of actuating devices. The total current may be formed from all of the output currents of the plural number of actuating devices. Thereby, an output current of an actuating device may depend on a test current pulse applied at the actuating device.

Moreover, the present invention relates to a method for controlling a plural number of actuating devices, whereas the method features the following steps:

Determination of a resistance value of the plural number of actuating devices in accordance with one embodiment of the aforementioned method for determining; and Generation of control signals for controlling the plural number of actuating devices by using the resistance values of the plural number of actuating devices.

The method for controlling may be advantageously carried out in conjunction with one embodiment of the aforementioned method for determining. In the step of generation, control signals may be generated, in which the resistance values of the plural number of actuating devices are taken into account. In the step of generating, a control signal may be generated for each of the plural number of actuating devices. The control signals may be pulse width modulation signals or pulse width modulated signals or the like. A control signal may be issued at an interface to an actuating device or at an interface to a current control device for an actuating device.

In addition, the present invention relates to a device for determining a resistance value of a plural number of actuating devices, whereas the device features the following characteristics:

a device for applying a test current pulse at each of the plural number of actuating devices; and a device for evaluating a total current of output currents of the plural number of actuating devices engaging on the test current pulses at a measuring resistor.

One embodiment of the aforementioned method for determining may be advantageously carried out in conjunction with the device for determining. The device for applying and, in addition or alternatively, the device for evaluating may be a part of the control unit, in particular a microcontroller or the like, or may be carried out by means of the same.

In addition, the present invention relates to a device for controlling a plural number of actuating devices, whereas the device features the following characteristics:

an embodiment of the aforementioned device for determining a resistance value of the plural number of actuating devices; and a device for generating control signals for controlling the plural number of actuating devices by using the resistance values of the plural number of actuating devices.

One embodiment of the aforementioned method for controlling may be advantageously carried out in conjunction with the device for controlling. The device for generating may be part of a control unit, in particular a microcontroller or the like, or may be carried out by means of the same.

In other words, the aforementioned device for determining may be advantageously deployed or used in conjunction with one embodiment of the method for determining. Thereby, the device for determining may be formed in order to carry out or implement the steps of the method for determining in corresponding devices. Moreover, the aforementioned device for controlling may be advantageously deployed or used in conjunction with one embodiment of the method for controlling. Thereby, the device for controlling may be formed in order to carry out or implement the steps of the method for controlling in corresponding devices.

In the present case, the device for determining and, in addition or alternatively, the device for controlling, is understood to be an electrical device that processes the output currents or output signals from actuating devices and, depending on these, determines resistance values of the actuating devices or generates the control signals taking into account the resistance values of the actuating devices. The control unit may feature an interface, which may be formed by means of hardware or software. With a hardware design, the interfaces may be, for example, part of a so-called "ASIC system," which includes various functions of the device. However, it is also possible that the interfaces are their own integrated circuits or at least partially consist of discrete components. With a software design, the interfaces may be software modules, which may be present, for example, on a microcontroller in addition to other software modules.

Also advantageous is a computer program product with a program code, on which a machine-readable carrier such as a semiconductor memory, a hard drive memory or an optical memory is stored, and which is used for carrying out one embodiment of the aforementioned method for determining and/or one embodiment of the aforementioned method for controlling, if the program is carried out on a computer or a device, for example, one embodiment of the aforementioned device for determining and/or device for controlling.

In accordance with embodiments of the present invention, in particular, a stabilization of test pulses for calculating actuator resistances or resistance values of a plural number of actuating devices may be realized. For example, a protection of actuator currents by means of total current shunts is also possible. Thus, a calculation of multiple actuator resistances, by means of a total current shunt with the assistance of test pulses, on the actuator current is facilitated. The actuator resistances may be calculated through the stabilization of test current pulses on several actuating devices and a change thereby apparent on an outgoing total current or a PWM control signal.

Advantageously, a precise knowledge of the actuator resistances may be obtained, which in turn facilitates an exact retrograde calculation of actually flowing electric currents. Knowing the actually flowing currents may be of vital importance for the security of a system, such as a transmission or even a vehicle, for which the determination of resistance is provided. A high degree of accuracy of the retrograde calculation of the current or the monitoring of the current may be realized with low costs or unit costs, as the case may be. For this purpose, it is not necessary to know in advance a temperature or a resistance of the actuator. Conveniently, resistances of means of connectivity or a connection technique, such as plugs, cables, transition resistances, corrosion through age, etc. between the control unit and the actuator have no influence on the achievable accuracy of the determination of resistance or on the accuracy of the monitoring of the current. As such, actuator resistances may be determined and (if applicable) monitored inexpensively, accurately and robustly, and also advantageously used for actuator control.

In order to determine and (if applicable) monitor the electric current actually flowing through the actuator, in accordance with the embodiments of the present invention, in particular, resort need not be made to the following approaches.

It is not necessary by means of a software module of the dimensions of actuator voltage, setpoint current through the actuator and resistance of the actuator to calculate whether a PWM signal adjusted by a current controller is plausible, by which the PWM of the current controller is to be measured. This can avoid the temperature of the actuator being calculated or estimated through additional sensors or software models, because the electrical resistance of the actuator depends on its own temperature, and this temperature is subject to extreme fluctuations through, for example, self-heating, oil temperature, ambient temperature, cooling, etc., and the accuracy of monitoring of the current is thus reduced. Moreover, the problem can be avoided by the fact that the sensors that may be present, such as oil temperature sensors, microcontroller temperature sensors, etc., only inaccurately indicate the actual temperature of the actuator. In this respect, it can be avoided that, without additional temperature sensors (e.g., for a coil temperature of the actuator), a required accuracy is not able to be represented or, with additional temperature sensors, an increased effort exists and practicality decreases.

Furthermore, there is no need to measure the current through each actuator by means of its own test circuit, such that, instead of this, a common test circuit may be used for all actuators in order to save space and costs.

Furthermore, existing tolerances of the current controller can be accepted as a permitted deviation. If, for example, there are four current controllers, they are led through a common shunt, and each controller has a maximum deviation of 10 mA during normal operation; thus, an error current of 40 mA at the total shunt is not always necessarily an error. Taking into account the additional tolerance chain, i.e. the shunt, the A-D converter accuracy, the A-D converter reference voltage accuracy, etc., only insufficient monitoring options of the currents would otherwise arise. Thus, the required accuracy of the measurement of the current would not be able to be presented.

In accordance with one embodiment of the method for determination, in the step of application, a first test current pulse at a first point in time may be applied at a first of the plural number of actuating devices and a second test current pulse at a second point in time different from the first point in time may be applied at a second of the plural number of actuating devices. Thereby, the test pulses may be switched one after the other or sequentially, as the case may be, at the actuating devices, or may be imprinted on input signals of the actuating devices. Thus, the pulses remain individually detectable in the total current or total signal, and the resistance values may be accurately determined.

Moreover, the method for determination may be carried out repeatedly in a cycle. Thereby, in definable time intervals, a cycle is repeated, with which test current pulses are applied at the actuating devices, and the total current is subsequently evaluated. Thereby, the resistance value of an actuating device may be accepted as constant up to the next test current pulse, because this physically cannot be arbitrarily changed rapidly. Thus, a particularly accurate and reliable determination of resistance is possible, whereas the determination may be repeated at suitable time intervals in order to achieve a depiction of actual values that is as exact as possible.

In accordance with one embodiment of the method for controlling, a step of the calculation of a temperature of the plural number of actuating devices may be provided based on the resistance values. Thereby, in the step of generation, the control signals may be generated using the temperatures of the plural number of actuating devices. Thereby, using reference data for a resistance-temperature relationship of actuating devices, a calculation or retrograde calculation, as the case may be, of the temperatures of the actuating devices may take place based on the specific resistance values. Thus, without using additional temperature sensors, temperatures of actuating devices, in particular within a system comprising the actuating devices, for example a vehicle transmission for improving shifting quality by knowing the coil temperature, may be calculated. Moreover, a plausibility check of temperature sensors for increasing functional security can be achieved. The monitoring of temperatures of actuating devices also allows for a switch-off when operating outside of the permitted limits. Thus, requirements for the cooling of actuating devices may be optimized; i.e., the actuating devices need not necessarily be elaborately cooled through additional measures, such as heat sinks, flowing oil or the like.

Moreover, a step of the monitoring of the total current in respect of status information indicating a disruption and, in addition or alternatively, an exceeding of the operating limits of the plural number of actuating devices can be provided. Thereby, in the step of generation, the control signals may be generated by using the status information. This allows for the detection of so-called "smooth short circuits or shunts," along with a monitoring of the temperatures of the actuating devices and a switch-off when operating outside of the permitted limits. Thus, the actuating devices may be operated more securely.

In accordance with one embodiment of the device for determination, the measuring resistor may be a low-impedance measuring resistor, in particular a shunt. A low-impedance measuring resistor may be, for example, a measuring resistor whose resistance value is less than 1 kΩ, in particular less than 500Ω, preferably less than 100Ω. Such a measuring resistor is advantageously sufficient for recording and (if applicable) monitoring multiple output currents. Thus, an accurate monitoring of multiple output currents is possible with only a total current shunt.

BRIEF DESCRIPTION OF THE DRAWINGS

The invention is more specifically illustrated as an example on the basis of the attached drawings. The following is shown.

Figure 1:
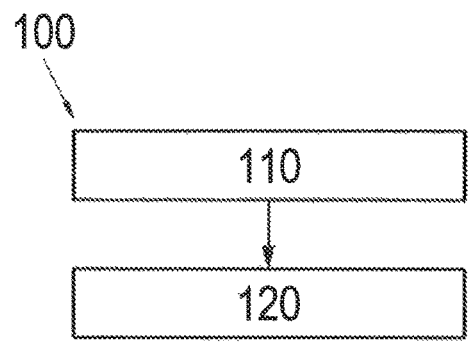
FIG. 1 a flow diagram of a method for determination in accordance with one embodiment of the present invention.

In the following description of preferred embodiments of the present invention identical or similar reference signs are used for similar-looking elements shown in the various figures, where a repeated description of these elements is omitted.

DETAILED DESCRIPTION

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

FIG. 1 shows a flow diagram of a method 100 for determining a resistance value of a plural number of actuating devices in accordance with one embodiment of the present invention. The method 100 features one step 110 of the application of a test current pulse at each of the plural number of actuating devices. Moreover, the method 100 features one step 120 of the evaluation of a total current of output currents of the plural number of actuating devices engaging on the test current pulses at a measuring resistor, in order to determine the resistance value of the plural number of actuating devices.

In accordance with one embodiment, in the step 110 of application, a first test current pulse at a first point in time is applied at a first of the plural number of actuating devices and a second test current pulse at a second point in time different from the first point in time is applied at a second of the plural number of actuating devices. In accordance with one embodiment, the method 100 is carried out repeatedly in a cycle. Thereby, the steps 110 and 120 are passed through in a cyclical manner.

Figure 2:
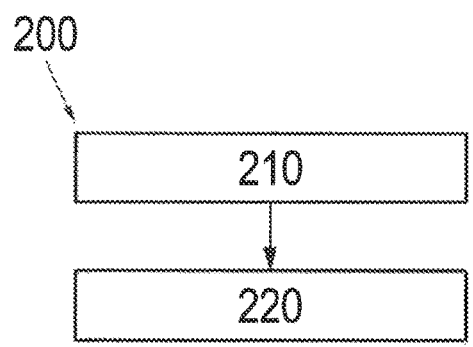
FIG. 2 a flow diagram of a method for controlling in accordance with one embodiment of the present invention.

FIG. 2 shows a flow diagram of a method 200 for controlling a plural number of actuating devices in accordance with one embodiment of the present invention. The method 200 features a step 210 of the determination of a resistance value of the plural number of actuating devices. Thereby, the step 210 of determination features the steps of the method for determination from FIG. 1. Thus, the method 200 is able to be carried out in conjunction with the method for determination from FIG. 1, or includes the steps of the method for determination from FIG. 1. Moreover, the method 200 features a step 220 of the generation of control signals for controlling the plural number of actuating devices by using the resistance values of the plural number of actuating devices.

In accordance with one embodiment, the method 200 features a step of the calculation of a temperature of the plural number of actuating devices based on the resistance values. Thereby, in the step 220 of generation, the control signals may be generated using the temperatures of the plural number of actuating devices. In accordance with one embodiment, the method 200 features a step of the monitoring of the total current in respect of status information indicating a disruption and/or exceeding of the operating limits of the plural number of actuating devices. Thereby, in the step 220 of generation, the control signals may be generated by using the status information.

Figure 3:
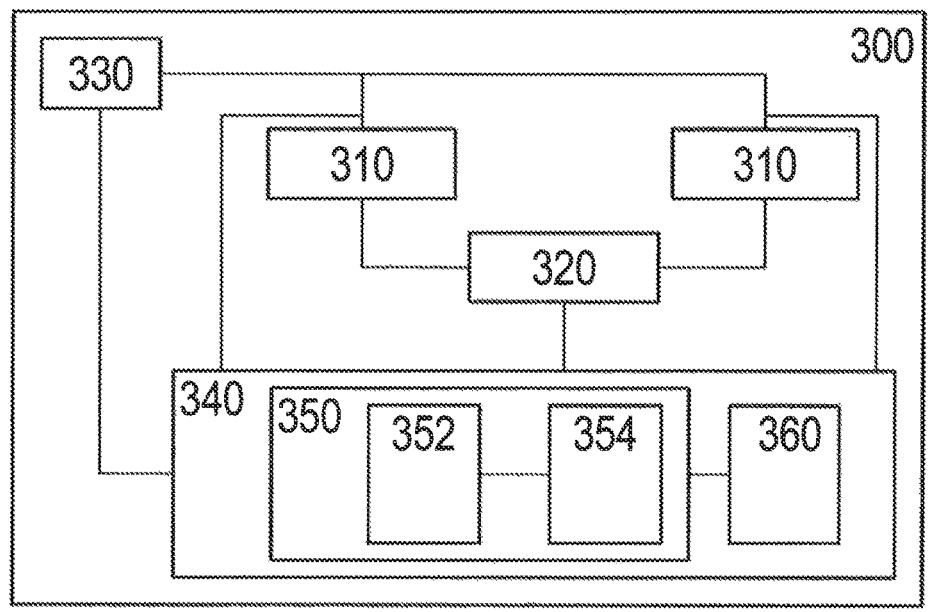
FIG. 3 a schematic representation of an actuating system with a plural number of actuating devices and a device for controlling in accordance with one embodiment of the present invention.

FIG. 3 shows a schematic representation of an actuating system 300 with a plural number of actuating devices and a device for controlling in accordance with one embodiment of the present invention. Thereby, of the actuating system 300, solely by example and based on the representation, two actuating devices 310, a measuring resistor or total current shunt 320, a control unit 330, a device for controlling or controlling device 340, a device for determining or determining device 350, a device for applying or application device 352, a device for evaluating or evaluating device 354 and a device for generating or generating device 360 are shown.

The method for determining from FIG. 1 and/or the method for controlling from FIG. 2 may be carried out in conjunction with the actuating system 300 or the controlling device 340, as the case may be. In accordance with the embodiment of the present invention shown in FIG. 3, the actuating system 300 comprises a transmission control unit of a motor vehicle, or a vehicle transmission with the transmission control unit. The controlling device 340 features the determining device 350 and the generating device 360. Thereby, the determining device 350 features the application device 352 and the evaluating device 354. In accordance with another embodiment, the control unit 330 and the controlling device 340 are combined into one device, several control units 330 are provided, for example, one for each actuating device 310, or no control unit 330 is provided. The control unit 330 may feature a current controller.

In accordance with the embodiment of the present invention represented in FIG. 3, the actuating devices 310 may be designed as magnetic valves or solenoid valves for transmission control. The actuating devices 310 are connected by means of connecting means on the input side to the control unit 330 in a manner that is capable of transmitting signals. The actuating devices 310 are connected by means of connecting means on the output side to the total current shunt 320 in a manner that is capable of transmitting signals. Thereby, the actuating devices 310 are connected in parallel between the control unit 330 and the total current shunt 320.

The controlling device 340 is formed in order to control the actuating devices 310. The determining device 350 is formed in order to determine resistance values of the actuating devices 310. To this end, the application device 352 of the determining device 350 is formed in order to apply a test current pulse at each of the actuating devices 310. For the application of the test current pulses, the controlling device 340 is attached in a manner that is capable of transmitting signals to the connecting means on the input side between the control unit 330 and the actuating devices 310. The evaluating device 354 is formed in order to evaluate a total current of output currents of the actuating devices 310 engaging on the test current pulses at the total current shunt 320. For the evaluation of the total current, the controlling device 340 is attached to the total current shunt 320 in a manner that is capable of transmitting signals. The generating device 360 is formed in order to generate control signals to control the actuating devices 310 using the resistance values of the actuating devices 310. The controlling device 340 is connected to the control unit 330 in a manner that is capable of transmitting signals. The controlling device 340 is formed in order to issue the control signals to the control unit 330.

Figure 4A:
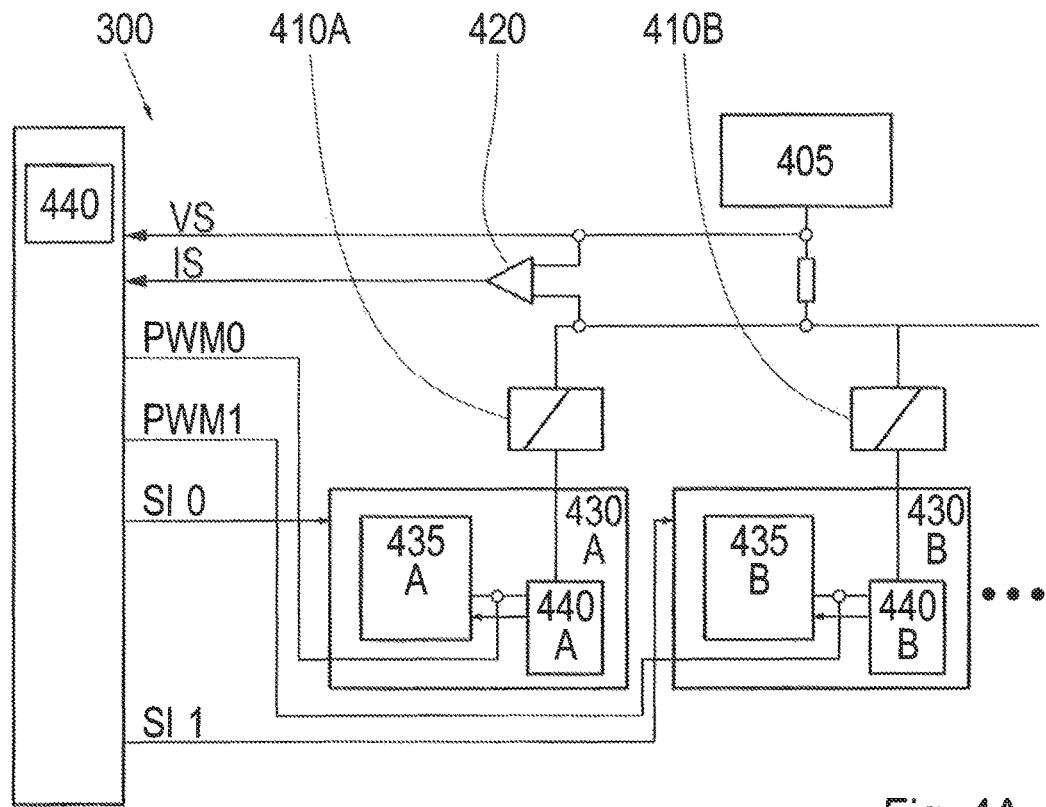
FIGS. 4A and 4B schematic representations of an actuating system in accordance with one embodiment of the present invention.

FIG. 4A shows a schematic representation of an actuating system 300 in accordance with one embodiment of the present invention. The actuating system 300 comprises, for example, an actuating system, such as the actuating system from FIG. 3. Thereby, of the actuating system 300, an internal power supply 405, a first actuating device 410A, a second actuating device 410B, a summation device 420, a first current controller 430A, a second current controller 430B, a first current source 435A, a second current source 435B, a microcontroller 440, a supply voltage VS, a total current IS, a first pulse width modulation signal PWM0, a second pulse width modulation signal PWM1, a first setpoint current SI0 and a second setpoint current SI1 are shown.

Each of the actuating devices 410A and 410B corresponds, for example, to the actuating device from FIG. 3. The first actuating device 410A is connected in an electrically conductive manner on the input side to the first current controller 430A, and is connected in an electrically conductive manner on the output side to the summation device 420. The first current controller 430A features the first current source 435A. The first current controller 430A also features the output stage 440A. The second actuating device 410B is connected in an electrically conductive manner on the input side to the second current controller 430B, and is connected in an electrically conductive manner on the output side to the summation device 420. The second current controller 430B features the second current source 435B. The second current controller 430B also features the output stage 440B. Three points marked at the right edge of FIG. 4A symbolize the fact that the actuating system 300 features additional actuating devices and current controllers, which, based on the representation, are not shown in FIG. 4A, but are schematically represented in FIG. 4B.

The summation device 420 is connected in an electrically conductive manner to the internal power supply device 405, the actuating devices 410A and 410B and the microcontroller 440. The summation device 420 is formed in order to accumulate an output current of the first actuating device 410A and an output current of the second actuating device 410B, which is to generate the total current IS.

The microcontroller 440 features, for example, the controlling device from FIG. 3. In other words, the microcontroller 440 is formed in order to, for example, carry out the method for determining from FIG. 1 and/or the method for controlling from FIG. 2. The microcontroller 440 is formed in order to receive the supply voltage VS from the internal power supply device 405. Moreover, the microcontroller 440 is formed in order to read the total current IS from the summation device 420. Moreover, the microcontroller 440 is formed in order to issue the first pulse width modulation signal PWM0 to the first current controller 430A, and to issue the second pulse width modulation signal PWM1 to the second current controller 430B. In addition, the microcontroller 440 is formed in order to apply the first setpoint current SI0 to the first current controller 430A, and to apply the second setpoint current SI1 to the second current controller 430B.

Figure 4B:
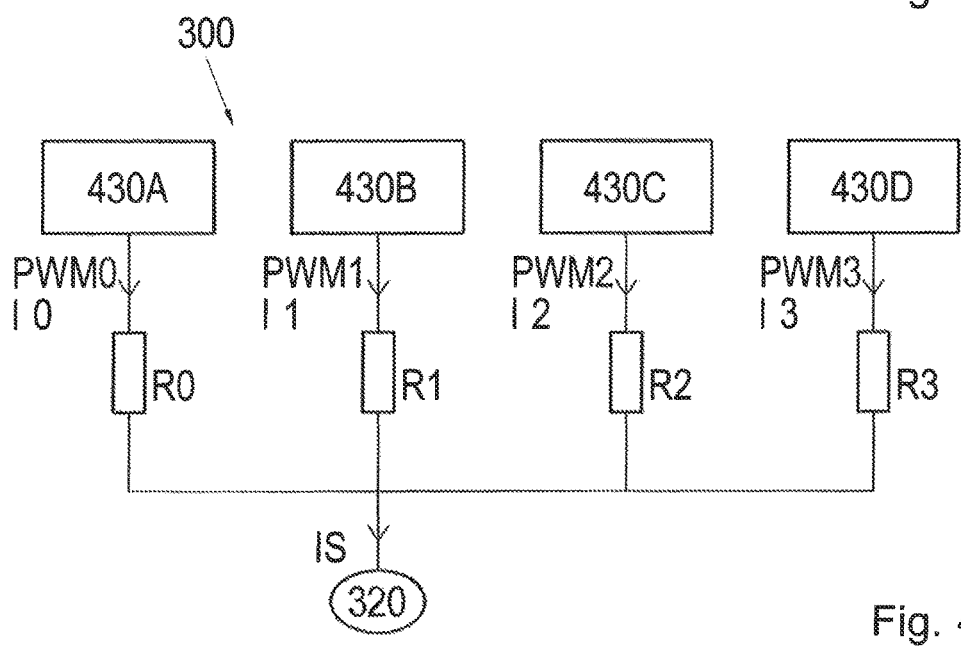

FIG. 4B shows another schematic representation of the actuating system 300 from FIG. 4A. Thereby, of the actuating system 300, the measuring resistor or total current shunt 320, the first current controller 430A, the second current controller 430B, a third current controller 430C, a fourth current controller 430D, the first pulse width modulation signal PWM0, the second pulse width modulation signal PWM1, a third pulse width modulation signal PWM2, a fourth pulse width modulation signal PWM3, a first current I0, a second current I1, a third current I2, a fourth current I3, a first actuator resistance R0, a second actuator resistance R1, a third actuator resistance R2, a fourth actuator resistance R3 and the total current IS are shown.

The first actuator resistance R0 represents a resistance value of the first actuating device from FIG. 3. Moreover, in FIG. 4B, the first actuator resistance R0 is symbolically represented in the drawing for the first actuating device from FIG. 3. The second actuator resistance R1 represents a resistance value of the second actuating device from FIG. 3. Moreover, in FIG. 4B, the second actuator resistance R1 is also symbolically represented in the drawing for the second actuating device from FIG. 3. The third actuator resistance R2 represents a resistance value of a third actuating device, which is only suggested in FIG. 3. Moreover, in FIG. 4B, the third actuator resistance R2 is symbolic represented in the drawing for a third actuating device, which is only suggested in FIG. 3. The fourth actuator resistance R3 represents a resistance value of a fourth actuating device, which is only suggested in FIG. 3. Moreover, in FIG. 4B, the fourth actuator resistance R3 is symbolically represented in the drawing for a fourth actuating device, which is only suggested in FIG. 3.

The first current controller 430A is connected on the output side in an electrically conductive manner to the first actuating device featuring the first actuator resistance R0. The first current controller 430A is formed in order to apply the first current I0 using the first pulse width modulation signal PWM0 to the first actuating device featuring the first actuator resistance R0. The first actuating device featuring the first actuator resistance R0 is switched between the first current controller 430A and the total current shunt 320.

The second current controller 430B is connected on the output side in an electrically conductive manner to the second actuating device featuring the second actuator resistance R1. The second current controller 430B is formed in order to apply the second current I1 using the second pulse width modulation signal PWM1 to the second actuating device featuring the first actuator resistance R1. The second actuating device featuring the second actuator resistance R1 is switched between the second current controller 430B and the total current shunt 320.

The third current controller 430C is connected on the output side in an electrically conductive manner to the third actuating device featuring the third actuator resistance R2. The third current controller 430C is formed in order to apply the third current I2 using the third pulse width modulation signal PWM2 to the third actuating device featuring the third actuator resistance R2. The third actuating device featuring the third actuator resistance R2 is switched between the third current controller 430C and the total current shunt 320.

The fourth current controller 430D is connected on the output side in an electrically conductive manner to the fourth actuating device featuring the fourth actuator resistance R3. The fourth current controller 430D is formed in order to apply the fourth current I3 using the fourth pulse width modulation signal PWM3 to the fourth actuating device featuring the first actuator resistance R3. The fourth actuating device featuring the fourth actuator resistance R3 is switched between the fourth current controller 430D and the total current shunt 320.

Figure 5A:
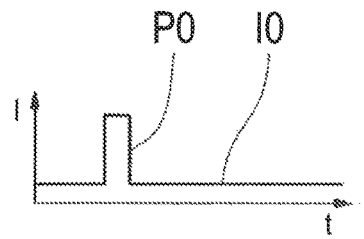
FIGS. 5A to 5I timing diagrams of signals in an actuating system in accordance with one embodiment of the present invention.
Figure 5E:
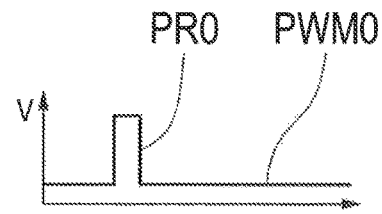
Figure 5B:
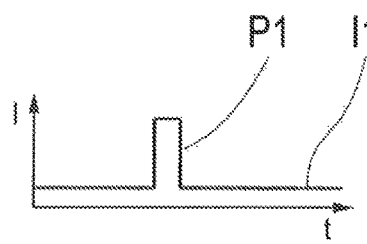
Figure 5F:
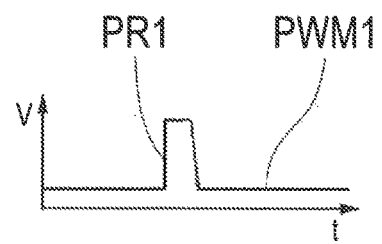
Figure 5C:
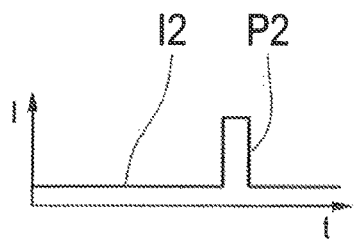
Figure 5G:
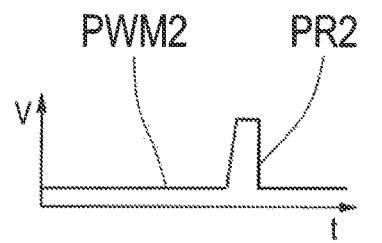
Figure 5D:
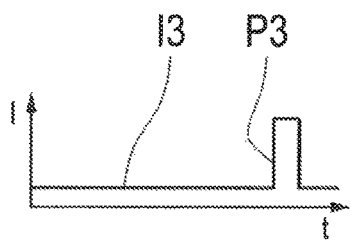
Figure 5H:
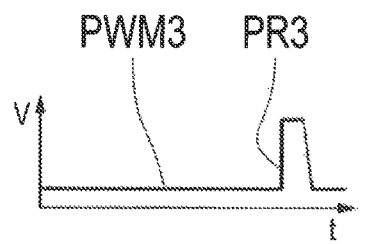
Figure 5I:
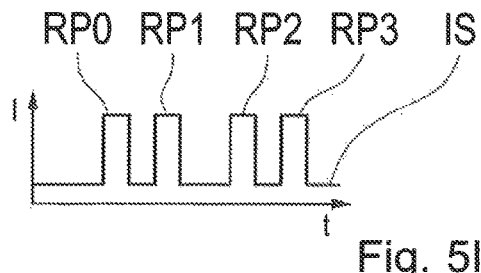

FIGS. 5A to 5I show timing diagrams of signals in the actuating system from FIGS. 4A and 4B. Thereby, the time t is plotted on the x-axis of each of the timing diagrams of FIGS. 5A to 5I. An electric current strength I is plotted on the y-axes of FIGS. 5A to 5D and 5I, and a voltage V is plotted on the y-axes of FIGS. 5E to 5H. To be precise, FIGS. 5A to 5D show a course of the currents I0 to I3, FIGS. 5E to 5H show a course of pulse width modulation signals PWM0 to PWM3 and FIG. 5I shows a course of the total current IS.

Thereby, FIG. 5A shows the course of the first current I0 with a first test current pulse P0. The first test current pulse P0 is a rectangular pulse at a first point in time. FIG. 5B shows the course of the second current I1 with a second test current pulse P1. The second test current pulse P1 is a rectangular pulse at a second point in time. FIG. 5C shows the course of the third current I2 with a third test current pulse P2. The third test current pulse P2 is a rectangular pulse at a third point in time. FIG. 5D shows the course of the fourth current I3 with a fourth test current pulse P3. The fourth test current pulse P3 is a rectangular pulse at a fourth point in time. Thus, it is evident that the test current pulses P0 to P3 are imprinted, chronologically one after the other, on the respective currents I0 to I3.

FIG. 5E shows the course of the first pulse width modulation signal PWM0 with a first pulse response PR0 or impulse response on the basis of the first test current pulse at the first current. FIG. 5F shows the course of the second pulse width modulation signal PWM1 with a second pulse response PR1 or impulse response on the basis of the second test current pulse at the second current. FIG. 5G shows the course of the third pulse width modulation signal PWM2 with a third pulse response PR2 or impulse response on the basis of the third test current pulse at the third current. FIG. 5H shows the course of the fourth pulse width modulation signal PWM3 with a fourth pulse response PR3 or impulse response on the basis of the fourth test current pulse at the fourth current. The pulse responses P0 to P3 occur chronologically one after the other in the respective signal sequences of the pulse width modulation signals PWM0 to PWM3. The pulse responses PR0 to PR3 feature only exemplary non-uniform signal forms, whereas the first pulse response PR0 is a rectangular pulse, the second pulse response PR1 resembles a rectangular pulse and features an inclined trailing edge, the third pulse response PR2 resembles a rectangular pulse and features an inclined rising edge and the fourth pulse response PR3 resembles a rectangular pulse and features an inclined trailing edge. The pulse width modulation signals PWM0-PWM3 comprise, for example, TTL signals (TTL, transistor-transistor logic) or other signals.

FIG. 5I shows the course of the total current IS with a first response pulse RP0 on the basis of the first test current pulse at the first current, a second response pulse RP1 on the basis of the second test current pulse at the second current, a third response pulse RP2 on the basis of the third test current pulse at the third current under a fourth response pulse RP3 on the basis of the fourth test current pulse at the fourth current. The response pulses RP0 to RP3 are rectangular pulses and occur chronologically one after the other in the sequence of the total current IS.

Figure 6:
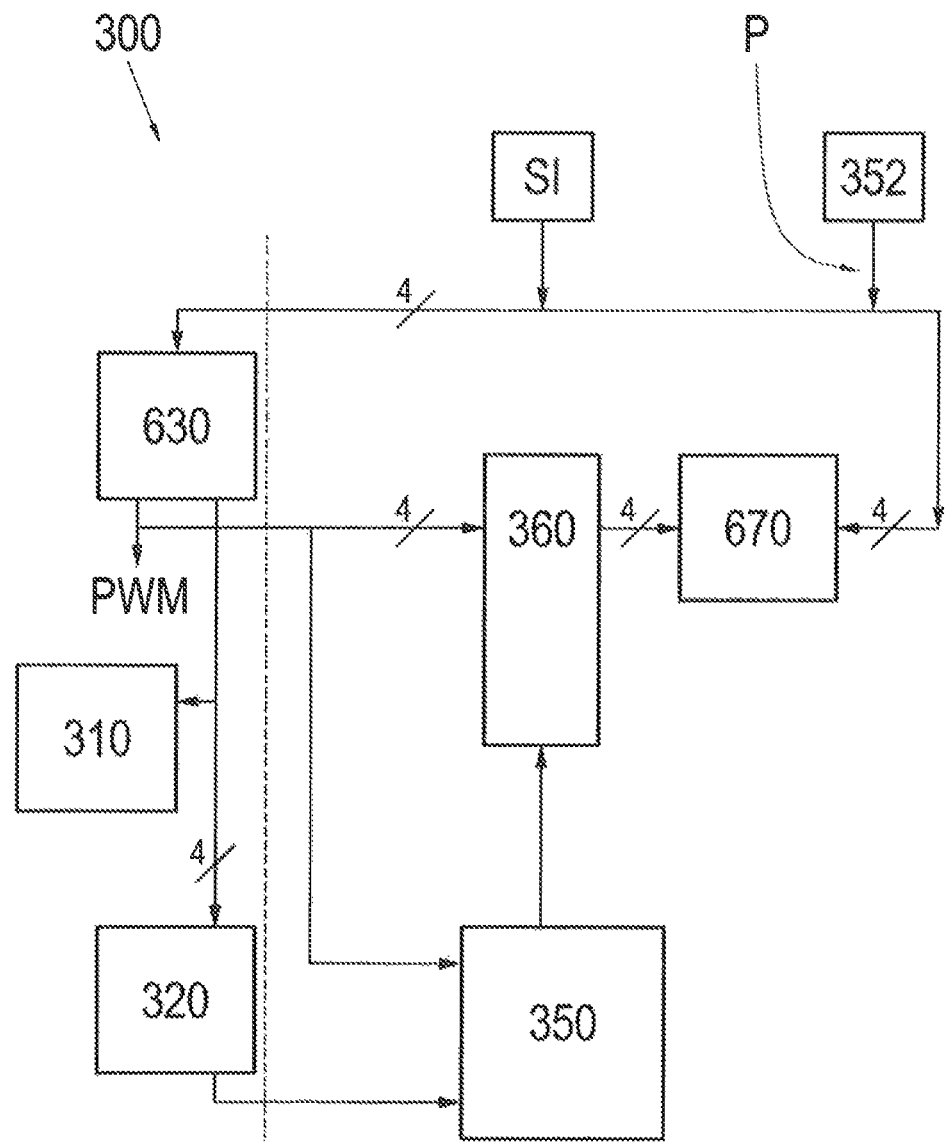
FIG. 6 a schematic representation of an actuating system in accordance with one embodiment of the present invention.

FIG. 6 shows a schematic representation of an actuating system 300 in accordance with one embodiment of the present invention. The actuating system 300 comprises, for example, an actuating system such as the actuating system from FIG. 3 or FIGS. 4A and 4B, whereas FIG. 6 shows another schematic representation. Thereby, of the actuating system 300, the actuating device 310, the total current shunt 320, the determining device 350, the application device 352, the generating device 360, a current controller 630, a comparator 670, a test current pulse P, a pulse width modulation PWM and a setpoint current SI are shown. The current controller 630 comprises, for example, one of the current controllers from FIGS. 4A and 4B, and the setpoint current SI comprises, for example, one of the setpoint currents from FIG. 4A. The test current pulse P represents, for example, one of the test current pulses from FIGS. 5A to 5D, and the pulse width modulation PWM represents, for example, one of the pulse width modulation signals from FIGS. 5E to 5H.

A separating line vertically marked in FIG. 6 symbolizes, solely by example, a partition of the actuating system 300 into a hardware side left of the separating line and a software side right of the separating line. By example and without limitation, the current controller 630, the pulse width modulation PWM, the actuating device 310 and the total current shunt 320 are located on the hardware side. By example and without limitation, an injection or call imprinting of the test current pulse P along with the setpoint current SI, the determining device 350, the generating device 360 and the comparator 670 are located on the software side.

The current controller 630 is connected in an electrically conductive manner to the actuating device 310 and the total current shunt 320 by means of connecting means, for example a four-wire bus. In addition, the current controller 630 is connected to the block of the pulse width modulation PWM. The total current shunt 320 is connected in an electrically conductive manner to the determining device 350. The current controller 630 is connected in an electrically conductive manner to the determining device 350. Moreover, the current controller 630 is connected in an electrically conductive manner to the generating device 360 by means of, for example, a control line featuring four wires. The generating device 360 is formed in order to calculate a current as a control signal for the actuating device 310. The generating device 360 is connected in an electrically conductive manner to the comparator 670 by means of, for example, a control line featuring four wires. The comparator 670 is connected in an electrically conductive manner to the current controller 630 by means of, for example, a control line featuring four wires, on which the test current pulse P and the setpoint current SI are able to be imprinted.

The embodiments described and shown in the figures are only selected as examples. Different embodiments may be combined with one another, completely or in reference to individual characteristics. Moreover, an embodiment may be supplemented by characteristics of a further embodiment. In addition, the process steps in accordance with the invention may be carried out repeatedly and in a sequence that is different than that described.

If one embodiment comprises an "and/or" link between a first characteristic and a second characteristic, this can be read in such a manner that the exemplary embodiment in accordance with one form of execution features both the first characteristic and the second characteristic, and in accordance with an additional form of execution features only the first characteristic or only the second characteristic.

The invention claimed is:

1. A method for determining a resistance value for each of a plurality of actuating devices, comprising:
separately applying a test current pulse onto an input signal of each of the actuating devices, wherein a current output from each of the actuating devices are all in parallel communication with a single measuring resistor, wherein the test current pulse is detectable within a total output current signal from all of the actuating devices at the common measuring resistor; and
evaluating the total output current signal from all of the actuating devices at the common measuring resistor in order to determine an individual resistance value for each of the respective actuating devices from a train of response pulses in the single total output current signal.

2. The method as in claim 1, wherein the step of applying a test current comprises applying a first test current pulse at a first point in time to a first one of the actuating devices, applying a second test current pulse at a second point in time different from the first point in time to a second one of the actuating devices, and applying subsequent test pulses at subsequent different points in time to each of the remaining actuating devices.

3. The method as in claim 2, wherein the method is repeated in cycles for the plurality of actuating devices.

4. A method for controlling a plurality of actuating devices, comprising:
determining a resistance value for each of the actuating devices in accordance with the method of claim 1; and
generating control signals for controlling each of the actuating devices based on the individual resistance values obtained for each of the actuating devices.

5. The method as in claim 4, further comprising calculating a temperature of each of the actuating devices based on the individual resistance values, and wherein the control signals are generated using the calculated temperature for each of the actuating devices.

6. The method as in claim 4, further comprising monitoring the total output current for status information indicating a disruption of or exceeding of operating limits of the actuating devices, and wherein the control signals are generated using the status information.

7. A device for determining a resistance value for each of a plurality of actuating devices, the device comprising:
a device that separately applies a pulse test current onto an input signal of each of the plurality of actuating devices, wherein each of the actuating devices has a current output and all of the current outputs are in parallel with a common measuring resistor, wherein the test current pulse is detectable within a total output current signal from all of the actuating devices at the common measuring resistor; and
a device that evaluates the total output current signal from all of the actuating devices at the common measuring to determine an individual resistance value for each of the respective actuating devices from a train of response pulses in the single total output current signal.

8. The device as in claim 7, wherein the measuring resistor is a low-impedance measuring resistor.

9. A device for controlling a plurality of actuating devices, comprising:
a device that determines a resistance value for each of the actuating devices in accordance with the device of claim 7; and
a device that generates control signals for controlling each of the actuating devices based on the individual resistance values obtained for each of the actuating devices.

* * * * *